United States Patent
Kim (10) Patent No.: US 12,557,413 B2
(45) Date of Patent: Feb. 17, 2026

(54) IMAGE SENSOR PACKAGE

(71) Applicant: Samsung Electronics Co., Ltd., Suwon-si (KR)

(72) Inventor: Sang-Uk Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 374 days.

(21) Appl. No.: 18/235,593

(22) Filed: Aug. 18, 2023

(65) Prior Publication Data

US 2024/0250100 A1     Jul. 25, 2024

(30) Foreign Application Priority Data

Jan. 20, 2023 (KR) .................. 10-2023-0008995

(51) Int. Cl.
H10F 39/00     (2025.01)

(52) U.S. Cl.
CPC ......... *H10F 39/804* (2025.01); *H10F 39/811* (2025.01)

(58) Field of Classification Search
CPC .. H10F 39/00; H10F 39/8027; H10F 39/8033; H10F 39/804; H10F 39/806; H10F 39/8063; H10F 39/811; H01L 23/00; H01L 23/31; H01L 23/3185; H01L 23/49811; H01L 23/49827; H01L 23/498; H01L 24/17; H01L 24/49
See application file for complete search history.

(56) References Cited

U.S. PATENT DOCUMENTS

| | | | |
|---|---|---|---|
| 8,119,311 B2 | 2/2012 | Fujimori et al. | |
| 8,698,265 B2 | 4/2014 | Yoon | |
| 11,335,719 B2 | 5/2022 | Cho et al. | |
| 2014/0312503 A1* | 10/2014 | Seo | H10F 39/804 257/774 |
| 2017/0154913 A1* | 6/2017 | Jun | H10F 39/018 |
| 2021/0257414 A1 | 8/2021 | Takada et al. | |
| 2021/0343771 A1 | 11/2021 | Iida et al. | |
| 2022/0085086 A1* | 3/2022 | Kim | C08K 3/36 |
| 2022/0115426 A1* | 4/2022 | Son | H01L 23/562 |

FOREIGN PATENT DOCUMENTS

| | | |
|---|---|---|
| JP | 2001157664 A | 6/2001 |
| JP | 2012099639 A | 5/2012 |

* cited by examiner

*Primary Examiner* — Brook Kebede
(74) *Attorney, Agent, or Firm* — Muir Patent Law, PLLC (57) ABSTRACT

An image sensor package according to an embodiment includes: an image sensor chip having a sensing area of a central part and an outer area surrounding the sensing area; a transparent substrate spaced apart from and above the image sensor chip and covering the image sensor chip; a bonding structure disposed between the image sensor chip and the transparent substrate and provided on an upper surface of the outer area; and a package substrate on which the image sensor chip is mounted and electrically connected to the image sensor chip, wherein the image sensor chip, on a plane, includes a photo absorption layer enclosing the edge of the sensing area and having a pattern protruded toward the bonding structure along a circumference.

20 Claims, 9 Drawing Sheets

IMAGE SENSOR PACKAGE

CROSS-REFERENCE TO RELATED APPLICATION

This application claims priority to and the benefit under 35 U.S.C. § 119 of Korean Patent Application No. 10-2023-0008995, filed on Jan. 20, 2023, in the Korean Intellectual Property Office, the entire contents of which are incorporated herein by reference.

BACKGROUND

1. Field

The present disclosure relates to an image sensor package including an image sensor chip.

2. Description of the Related Art

An image sensor chip is an electronic component that detects strength and color of an optical image to be converted into digital image data, and enables storage, transmission, and reproduction of the image. The image sensor chip is well known as a core part of digital cameras, smartphones, automobiles, security devices, and robots.

To protect the image sensor chip, prevent external materials from penetrating the image area of the image sensor chip, and enable power supply and signal output between the image sensor chip and the substrate, the image sensor chip is incorporated into a device in a form of an image sensor package.

Meanwhile, in the image sensor chip, when light is reflected and incident on the image sensor, a ghost phenomenon or a flare phenomenon in which a circular edge that does not actually exist, a spread of light, and dots of light are included in the image may occur.

Accordingly, a light absorption layer for preventing reflected light is formed on the outer portion of the image sensor chip to prevent the flare. However, when the image sensor chip is assembled in a package form, an overlap between the light absorption layer of the image sensor chip and a bonding structure (e.g., an adhesive material) may occur.

When the light absorption layer and the bonding structure overlap, a stress may be generated due to a difference in coefficients of thermal expansion (CTE) between materials thereof, and a peeling problem in the layer of the image sensor chip in contact with the bonding structure, may occur.

SUMMARY

One aspect is to provide an image sensor package capable of preventing a flare and preventing peeling of a surface layer of an image sensor chip.

An image sensor package according to an embodiment includes: an image sensor chip having a sensing area of a central part and an outer area surrounding the sensing area; a transparent substrate above and spaced apart from the image sensor chip and covering the image sensor chip; a bonding structure disposed between the image sensor chip and the transparent substrate and provided on an upper surface of the outer area; and a package substrate on which the image sensor chip is mounted and electrically connected to the image sensor chip, wherein the image sensor chip, on a plane, includes a photo absorption layer enclosing the edge of the sensing area and having a pattern protruded toward the bonding structure along a circumference of the photo absorption layer.

On a plane, the end of the pattern in the outer direction may overlap the bonding structure.

On a plane, the end of the pattern in the outer direction may be spaced apart from the bonding structure.

A chip pad may be provided on the upper surface of the outer area, the package substrate may be provided with a substrate pad, and the chip pad and the substrate pad may be electrically connected to each other.

The bonding structure may include an adhesive layer bonding the transparent substrate and the image sensor chip.

The bonding structure may further include a ring-shaped spacer extending along the circumference of the lower surface of the transparent substrate.

The image sensor chip may be positioned on the package substrate and be electrically connected to the package substrate through a conductive wire connecting the chip pad and the substrate pad.

An encapsulant disposed on the package substrate, and encapsulating the side of the image sensor chip, the side of the transparent substrate, the adhesive layer, and the conductive wire may be further included.

An external connection terminal disposed on the lower surface of the package substrate and electrically connected to the substrate pad may be further included.

The adhesive layer, on a plane, may be continuously extended along the edge of the outer area.

The package substrate may include: a connection substrate having an opening provided to expose the sensing area and surrounding the edge of the upper surface and the side surface of the image sensor chip; and a base substrate electrically connected to the connection substrate, combined with the connection substrate, and supporting the lower surface of the image sensor chip, and the transparent substrate may be attached on the connection substrate.

An extension opening extending the opening may be provided at the lower part of the connection substrate and the image sensor chip may be provided in the extension opening, and the substrate pad may be provided on the lower surface of the connection substrate and faces the chip pad.

The bonding structure may include a bump connecting the chip pad and the substrate pad; and an encapsulant filling the space between the image sensor chip and the connection substrate and encapsulating the bump.

The connection substrate may include a conductive line that electrically connects the substrate pad and the base substrate.

An image sensor package of an embodiment includes: an image sensor chip having a sensing area having a microlens array on an upper surface and an outer area surrounding the sensing area and having a chip pad; a transparent substrate spaced apart from and above the image sensor chip and covering the image sensor chip; a bonding structure disposed between the image sensor chip and the transparent substrate and provided on an upper surface of the outer area; a package substrate on which a substrate pad is provided on one surface and the image sensor chip is mounted and electrically connected to the image sensor chip; and a conductive bonding member connecting the chip pad and the substrate pad, wherein the image sensor chip, on a plane, includes a photo absorption layer surrounding the microlens array and having a pattern protruded toward the bonding structure along a circumference of the photo absorption layer.

The image sensor chip, in a cross-section, may further include a semiconductor layer and a passivation layer on the semiconductor layer, and the photo absorption layer may be positioned between the semiconductor layer and the passivation layer.

The pattern may have a shape in which a protruding portion of a polygonal shape or an arc-shape is repeated on a plane.

The pattern may have a shape in which a triangle with one vertex facing the bonding structure is continuously repeated on a plane.

The triangle may have a convex or concave form of two sides defining the one vertex.

An image sensor package of an embodiment includes: an image sensor chip having a sensing area having a microlens array on an upper surface and an outer area surrounding the sensing area and having a chip pad; a transparent substrate spaced apart above the image sensor chip and covering the image sensor chip; a bonding structure disposed between the image sensor chip and the transparent substrate and provided on an upper surface of the outer area; a package substrate on which a substrate pad is provided on one surface and the image sensor chip is mounted and electrically connected to the image sensor chip; a conductive bonding member connecting the chip pad and the substrate pad; and an external connection terminal provided on the package substrate, electrically connected to the substrate pad, and protruded to the outside, wherein the image sensor chip, on a plane, includes a photo absorption layer surrounding the microlens array, and having a pattern of a sawtooth shape or a comb shape that is protruded toward the bonding structure along a circumference of the photo absorption layer.

According to an embodiment, by forming the photo absorption layer having a specific pattern, it is possible to prevent a delamination phenomenon of a surface layer of the image sensor chip due to a bonding structure while improving noise due to a flare.

DETAILED DESCRIPTION

Hereinafter, examples of the present disclosure will be described in detail with reference to the attached drawings so that the person of ordinary skill in the art may easily implement the present disclosure. However, the present disclosure may be modified in various ways and is not limited to the examples described herein.

In the drawings, elements irrelevant to the description of the present disclosure are omitted for simplicity of explanation, and like reference numerals designate like elements throughout the specification and drawings.

Since size and thickness of each component illustrated in the drawings are arbitrarily represented for convenience in explanation, the present disclosure is not particularly limited to the illustrated size and thickness of each component and the thickness is enlarged and illustrated in order to clearly express various parts and areas.

Throughout the specification, when it is described that a part is "connected" or "coupled)" to another part, the part may be "directly connected" or coupled to or on the other element or intervening elements may be present. In contrast, when an element is referred to as being "directly connected" or "directly coupled" to another element, or as "contacting" or "in contact with" another element (or using any form of the word "contact"), there are no intervening elements present at the point of contact. In addition, unless explicitly described to the contrary, the word "comprise", and variations such as "comprises" or "comprising", will be understood to imply the inclusion of stated elements but not the exclusion of any other elements.

It will be understood that when an element such as a layer, film, area, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

Further, in the specification, the phrase "on a plane" means when an object portion is viewed from above, and the phrase "on a cross-section" means when a cross-section taken by vertically cutting an object portion is viewed from the side.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes.

Hereinafter, image sensor packages of various example embodiments will be described with reference to drawings.

Figure 1:
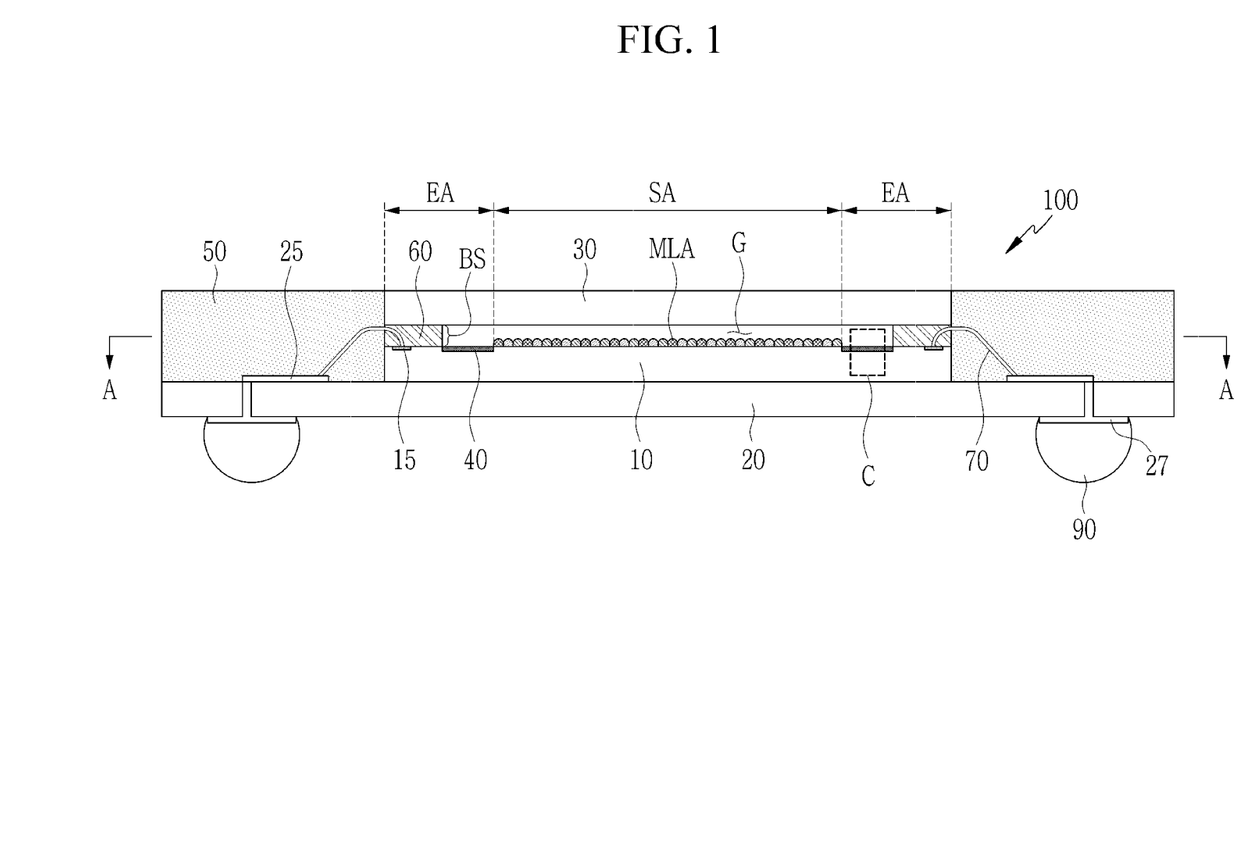
FIG. 1 is a cross-sectional view showing an image sensor package according to an example embodiment.
Figure 2:
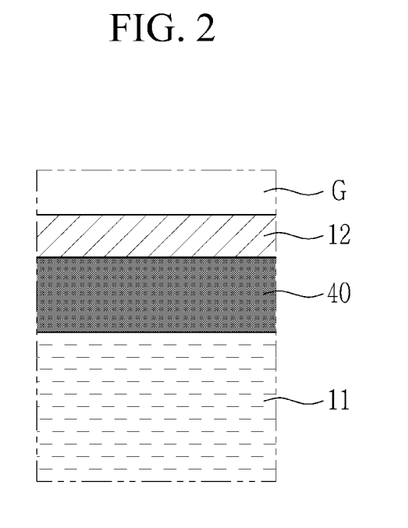
FIG. 2 is an enlarged view of a portion C of FIG. 1.
Figure 3:
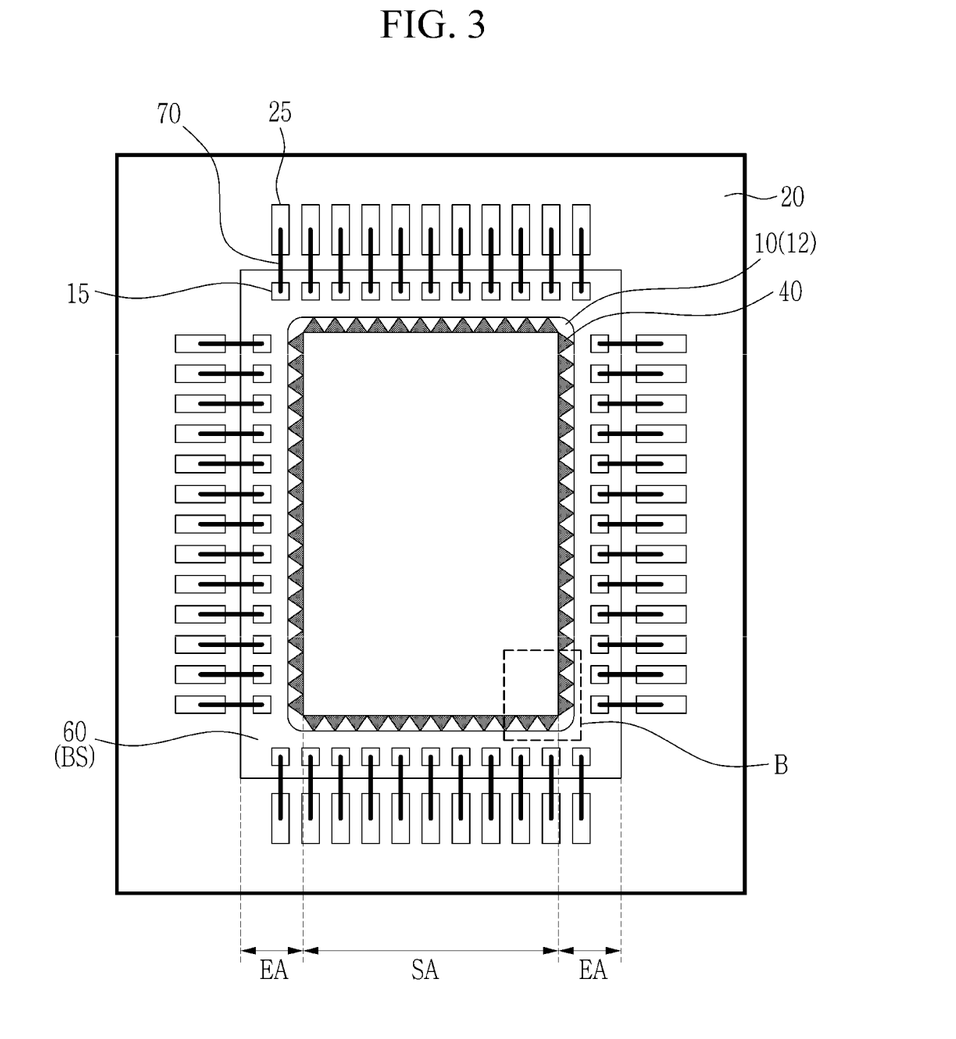
FIG. 3 is a cross-sectional view of a direction A-A in FIG. 1.

FIG. 1 is a cross-sectional view showing an image sensor package of an example embodiment, FIG. 2 is an enlarged view of a portion C of FIG. 1, and FIG. 3 is a cross-sectional view of a direction A-A in FIG. 1. For ease of understanding, FIG. 1 shows a cross-section cut vertically, and in FIG. 3, some components (e.g., an encapsulant 50) are omitted.

Referring to FIG. 1 and FIG. 3, an image sensor package 100 according to an example embodiment includes an image sensor chip 10, a transparent substrate 30, a bonding structure BS, and a package substrate 20.

According to an embodiment, the image sensor chip 10 includes a photo absorption layer 40 having an optimized pattern, thereby improving noise caused by a flare, and preventing a delamination phenomenon of a surface layer (e.g., a passivation layer) of the image sensor chip 10. A detailed description related thereto is provided in the corresponding section.

The image sensor chip 10 is a semiconductor device that converts light collected from the outside into an electric signal, and may include a CMOS image sensor (CIS).

The image sensor chip 10 has upper and lower surfaces facing away each other, and may include a sensing area SA of a central part and an outer area EA surrounding the sensing area SA.

The sensing area SA of the image sensor chip 10 may include a pixel array including a plurality of unit pixels. A plurality of unit pixels may be arranged in a two-dimensional array form.

A plurality of unit pixels may be, for example, a passive pixel sensor or an active pixel sensor. Each of a plurality of unit pixels may include a photodiode sensing light, a transfer transistor transmitting charges generated by the photodiode, a floating diffusion area storing the transmitted charges, a reset transistor periodically resetting the floating diffusion area, and a source follower that buffers the signals according to the charges charged in the floating diffusion area.

A sequential color filter array (not shown) and a microlens array (MLA) may be provided on a plurality of unit pixels of the sensing area SA.

The color filter array may include a plurality of color filters. A plurality of color filters, for example, may include an R (red) filter, a B (blue) filter, and a G (green) filter. Also, a plurality of color filters may include a C (cyan) filter, a Y (yellow) filter, and an M (magenta) filter. On each on a plurality of unit pixels, a color filter including one among the R filter, the B filter, and the G filter, or one among the C filter, the Y filter, and the M filter, may be disposed. Each of a plurality of unit pixels may recognize one color by detecting components of separated incident light.

The microlens array MLA may include a plurality of hemispherical microlenses. A plurality of microlenses may focus light incident on the sensing area SA to a plurality of unit pixels.

The outer area EA of the image sensor chip 10 is an area around the sensing area SA, and may be an edge area of the image sensor chip 10. In example embodiments, the outer area EA of the image sensor chip 10 may be provided at each side of the sensing area SA. For example, the outer area EA may completely surround the sensing area SA. A plurality of chip pads 15 may be provided on the upper surface of the outer area EA. In example embodiments, a plurality of chip pads 15 may be provided on the upper surface of the outer area EA on each side of the sensing area SA.

The chip pad 15 may be electrically connected to a plurality of unit pixels in the sensing area SA. The chip pad 15 may include a metal such as copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), ruthenium (Ru), etc., or combinations thereof.

Referring to FIG. 3, the chip pad 15 may be arranged along the outer area EA on the upper surface of the image sensor chip 10, and may be formed to be exposed through the upper surface of the image sensor chip 10.

The image sensor chip 10 includes the photo absorption layer 40. The photo absorption layer 40 is a part blocking light incident through the side of the image sensor chip 10 to prevent image distortion.

Referring to FIG. 2, the image sensor chip 10 includes a semiconductor layer 11 including silicon, etc., and a passivation layer 12 of an uppermost surface on a cross-section in a vertical direction. The aforementioned photo absorption layer 40 may be positioned between the semiconductor layer 11 and the passivation layer 12. For example, the photo absorption layer 40 may be positioned at the same level as the aforementioned color filter array.

According to an example embodiment, the photo absorption layer 40 may have a shape surrounding the edge of the sensing area SA, for example, the microlens array MLA, on a plane. For example, referring to FIG. 3, it may have a ring shape as a whole.

The photo absorption layer 40 may include an ink composition that is the same material as the color filters. The ink composition may include a low molecular, polymer, or organic material, and for example, the photo absorption layer 40 may include a photosensitive material including a black color pigment.

The photo absorption layer 40 may be formed through a photolithography process.

According to an example embodiment, the photo absorption layer 40 may have a pattern protruded toward the bonding structure BS to be described later on a plane in order to prevent the peeling of the passivation layer 12 while preventing the flare. That is, the photo absorption layer 40 may be positioned in the space between the microlens array MLA and the bonding structure BS on a plane. At this time, it is possible to have the pattern protruded toward the bonding structure BS to minimize the area overlapping with the photo absorption layer 40 while maximally covering the space between the microlens array MLA and the bonding structure BS. A detailed configuration of the pattern of the photo absorption layer 40 will be described later.

The transparent substrate 30 is a portion through which light passes, and may be made of a transparent polymer material such as an acrylic, or glass.

The transparent substrate 30 may be spaced apart and disposed on the image sensor chip 10 and may cover the image sensor chip 10. For example, the lower surface of the transparent substrate 30 may be parallel to the upper surface of the image sensor chip 10, and may have a substantially equivalent width and area to that of the image sensor chip 10. Alternatively, it may have the width and area greater than or less than the image sensor chip 10.

The transparent substrate 30 may include an optical filter capable of passing or blocking light of a specific wavelength band, and for example, the transparent substrate 30 may include an infrared (IR) filter filtering infrared or near infrared rays.

The bonding structure BS is a part for bonding other components on the image sensor chip 10, and may be disposed between the image sensor chip 10 and the transparent substrate 30. In example embodiments, side surfaces of the bonding structure BS may be aligned with side surfaces of the image sensor chip 10 and the transparent substrate 30. For example, side surfaces of the bonding structure BS, the image sensor chip 10, and the transparent substrate 30 may be coplanar.

The bonding structure BS may be provided on the upper surface of the outer area EA of the image sensor chip 10. For example, the bonding structure BS may have a ring shape along the upper surface of the outer area EA of the image sensor chip 10. By the bonding structure BS, a separation space G may be formed between the image sensor chip 10 and the transparent substrate 30, and the inflow of external moisture or a contaminant material into the separation space G may be prevented.

According to an example embodiment, as shown in FIG. 1, the bonding structure BS may include a bonding layer 60.

The bonding layer 60 is disposed between the transparent substrate 30 and the image sensor chip 10 in a ring shape along the upper surface of the outer area EA of the image sensor chip 10, and the transparent substrate 30 and the image sensor chip 10 may be bonded to each other.

The bonding layer 60 may include an adhesive (a glue), and for example, an epoxy resin or other adhesive materials. According to an example embodiment, the bonding layer 60 may have UV curability. For example, after coating the bonding layer 60 in a ring shape along the upper surface of the outer area EA of the image sensor chip 10, by curing it by UV irradiation, the transparent substrate 30 may be bonded onto the image sensor chip 10 through the bonding layer 60. However, it is not limited thereto, and it may have a property that a shape is changed fluidly by heat or pressure.

The package substrate 20 is a part supporting the image sensor chip 10, and the image sensor chip 10 may be mounted on the package substrate 20 so that the package substrate 20 may be electrically connected to the image sensor chip 10.

Referring to FIG. 1, the package substrate 20 of an example embodiment may support the lower surface of the image sensor chip 10 and may be arranged in parallel with the image sensor chip 10. For example, the package substrate 20 may include a printed circuit board (PCB). However, it is not limited thereto, and the package substrate 20 may include a ceramic leadless chip carrier (CLCC) and a plastic leaded chip carrier (PLCC). Also, the package substrate 20 may include a plurality of redistribution vias, a plurality of redistribution lines, and a redistribution layer formed of an insulation layer.

According to an embodiment, the package substrate 20 may have a larger width and a larger area than the image sensor chip 10. A substrate pad 25 may be provided on the upper surface of the package substrate 20. In example embodiments, the substrate pad 25 may be provided in plural and may surround the image sensor chip 10.

The package substrate 20 may be electrically connected to the image sensor chip 10 through the conductive bonding member 70. For example, the conductive bonding member 70 may include a conductive wire. Referring to FIG. 1 and FIG. 3, the conductive bonding member 70 may be provided in plural, and each of the conductive bonding members 70 may connect one of the chip pads 15 to a corresponding one of the substrate pads 25. For example, the image sensor chip 10 may be positioned on the package substrate 20 and may be electrically connected to the package substrate 20 through a conductive wire (e.g., conductive bonding member 70) connecting the chip pad 15 and the substrate pad 25.

An external connection terminal 90 may be provided on the lower surface of the package substrate 20 to physically and electrically connect the image sensor package 100 to an external substrate. The external connection terminal 90 may be electrically connected to the substrate pad 25 through an electrical wire provided inside the package substrate 20. For example, the external connection terminal 90 may be connected to a conductive pad 27 provided on the lower surface of the package substrate 20. The external connection terminal 90 may include a solder, and for example, may include solder balls.

According to an example embodiment, an encapsulant 50 may be disposed on the upper surface of the package substrate 20. The encapsulant 50 may encapsulate the side of the image sensor chip 10, the side of the transparent substrate 30, the adhesive layer 60, and a conductive bonding member 70 (e.g., a conductive wire). The encapsulant 50 may contact side surfaces of the image sensor chip 10, the transparent substrate 30, and the adhesive layer 60 and top surfaces of the package substrate 20 and the substrate pads 25. In example embodiments, a top surface of the encapsulant 50 may be coplanar with a top surface of the transparent substrate 30.

The encapsulant 50 may include a molding compound, a molding underfill, an epoxy, and/or a resin, and may be, for example, epoxy molding compounds (EMCs).

The encapsulant 50 may cover the upper surface of the package substrate 20 while encapsulating the side surface of the transparent substrate 30 so as to expose the transparent substrate 30. The encapsulant 50 may have a flat upper surface of the same height as the transparent substrate 30, but it is not limited thereto, and the upper surface may have an inclined shape (referring to FIG. 4) or a curved upper surface.

Meanwhile, not only the encapsulant 50, but also the bonding structure BS described above may have a modified form, which will be described below through drawings.

Figure 4:
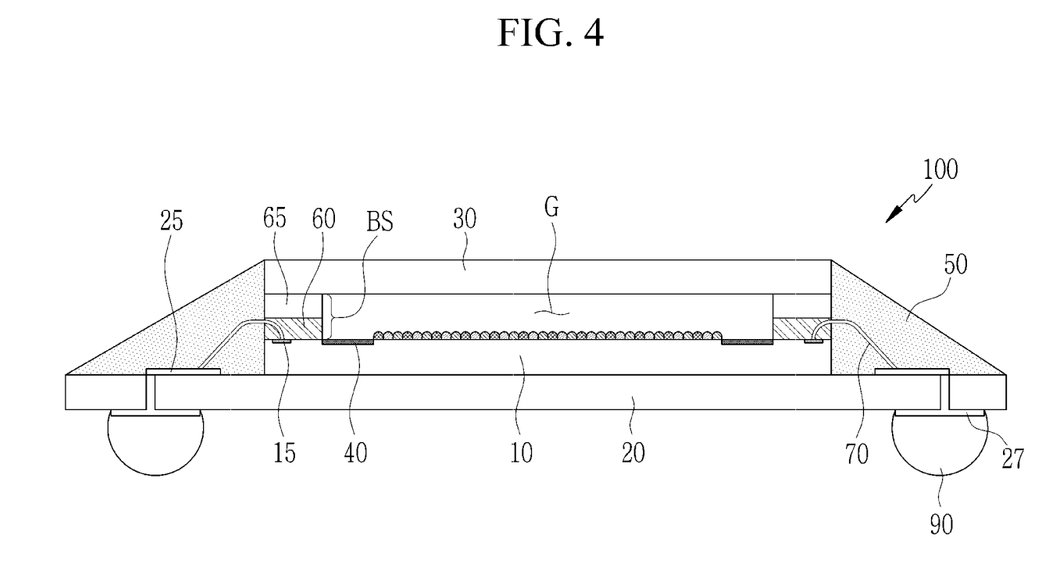
FIG. 4 is a cross-sectional view showing an image sensor package according to another example embodiment.

FIG. 4 is a cross-sectional view showing an image sensor package according to another example embodiment. In FIG. 4, compared to the embodiment shown in FIG. 1 previously described, there are differences in the form of the encapsulant 50 and the bonding structure BS, and all other things are the same.

As shown in FIG. 4, according to an embodiment, the bonding structure BS may further include a spacer 65 as well as the above-described bonding layer 60.

The spacer 65 may be disposed between the image sensor chip 10 and the transparent substrate 30, and may be disposed in the outer area EA of the image sensor chip 10 on a plane. For example, referring to FIG. 4, the spacer 65 may be in contact with the transparent substrate 30. For example, the spacer 65 may have a ring shape extending along the circumference of the lower surface of the transparent substrate 30. In example, embodiments, the spacer 65 may contact a top surface of the bonding layer 60. For example, as shown in FIG. 4, the spacer 65 may be disposed on the bonding layer 60, but is not limited thereto, and the spacer 65 may have a form surrounded by the bonding layer 60.

Since the spacer 65 may separate the image sensor chip 10 and the transparent substrate 30, it is possible to form a more sufficient separation space G between the image sensor chip 10 and the transparent substrate 30 than the shape of FIG. 1 described above. For example, the separation space G illustrated in FIG. 4 may have a greater height in a direction perpendicular to the top surface of the package substrate 20 than a height of the separation space G illustrated in FIG. 1.

The spacer 65 may include an insulating material. For example, the spacer 65 may include at least one of a polyimide, a photoresist, and a dry film photoresist (DFR).

On the other hand, as described above, the image sensor chip 10 includes the photo absorption layer 40 having the pattern protruded toward the bonding structure BS on a plane. Hereinafter, the pattern of the photo absorption layer 40 will be described in detail.

Figure 5:
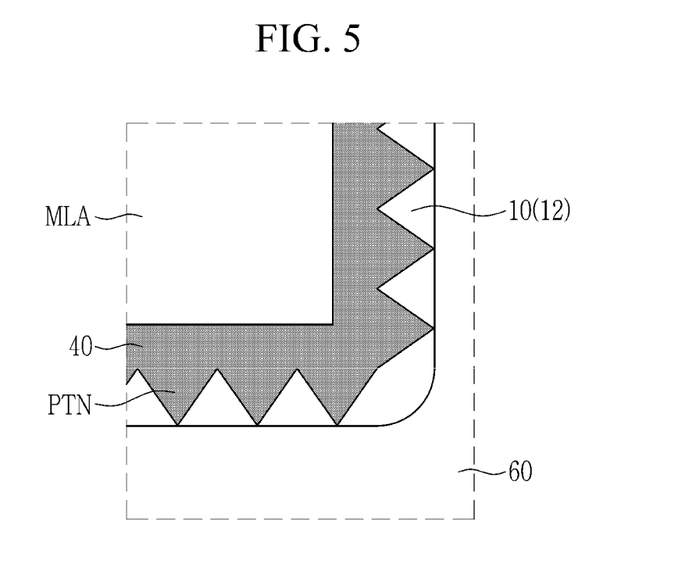
FIG. 5 is an enlarged view of a portion B of FIG. 3.

FIG. 5 is an enlarged view of a portion B of FIG. 3, and FIG. 6 to FIG. 11 are enlarged views of various shapes of a portion B of FIG. 3. In FIG. 5 to FIG. 11, for convenience of understanding, the embodiment in which the bonding layer 60 is included in the bonding structure BS is shown, but it is not limited thereto. For example, in the case of the embodiment shown in FIG. 4 or FIG. 12, other configurations may correspond instead of the bonding layer 60. However, in the following description, an embodiment in which the bonding layer 60 is included in the bonding structure BS will be described as an example.

Referring to FIG. 5, on a plane, the photo absorption layer 40 may include a pattern PTN protruded toward the bonding layer 60 (or a bonding structure, it is the same in the description below). Through this, it is possible to prevent the peeling of the passivation layer 12 while preventing the flare.

In more detail, in FIG. 5, when the photo absorption layer 40 covers only a part of the space between the microlens array MLA and the bonding layer 60 without the pattern PTN, if the light is reflected and enters the image sensor, a ghost or flare phenomenon in which a circular border, light spread, and light dots, that do not actually exist, are included in the image may occur.

In contrast, when the photo absorption layer 40 is formed large enough to cover the entire space between the microlens array MLA and the bonding layer 60 without the pattern PTN, in the manufacturing process, some areas of the photo absorption layer 40 may overlap with the bonding layer 60. At this time, the stress is generated in the passivation layer 12 due to a difference in coefficients of thermal expansion (CTE) between the bonding layer 60, the photo absorption layer 40, and the semiconductor layer 11, which are formed of different materials. Accordingly, a phenomenon in which the passivation layer 12 is peeled may occur.

Therefore, it is preferable that the photo absorption layer 40 is formed to cover the space between the microlens array MLA and the bonding layer 60 as much as possible while minimizing the area overlapping with the bonding layer 60.

Accordingly, the photo absorption layer 40 of an embodiment may have a shape including the pattern PTN protruded toward the bonding layer 60. For example, due to the protruded pattern PTN of the photo absorption layer 40, the space between the microlens array MLA and the bonding layer 60 may be covered as much as possible through the photo absorption layer 40 while minimizing the area where the photo absorption layer 40 overlaps with the bonding layer 60. Hereinafter, various types of the patterns PTN of the photo absorption layer 40 will be described.

The photo absorption layer 40 may have a shape surrounding the edge of the microlens array MLA, and a protruded pattern PTN may be continuously formed on the outer side toward the bonding layer 60. As described above, the photo absorption layer 40 may be formed through a photolithography process, and the protruded pattern PTN may be formed using a mask. For example, the photo absorption layer 40 may have a sawtooth pattern PTN.

Figure 6:
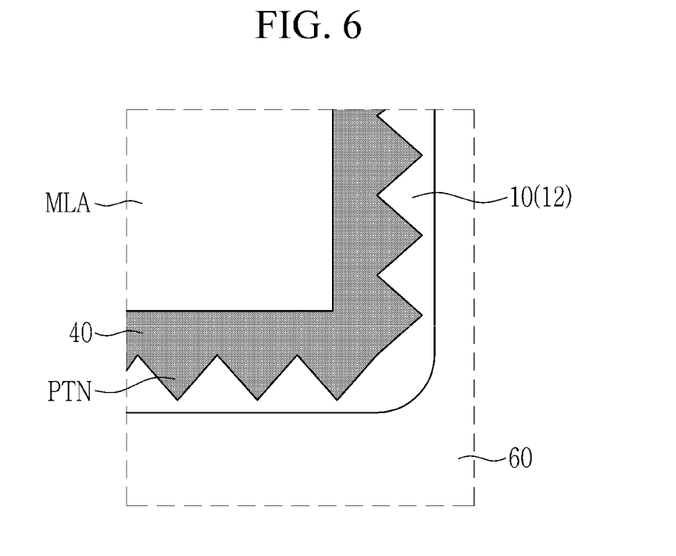
FIG. 6 to FIG. 11 are enlarged views of various shapes of a portion B of FIG. 3 according to example embodiments.
Figure 7:
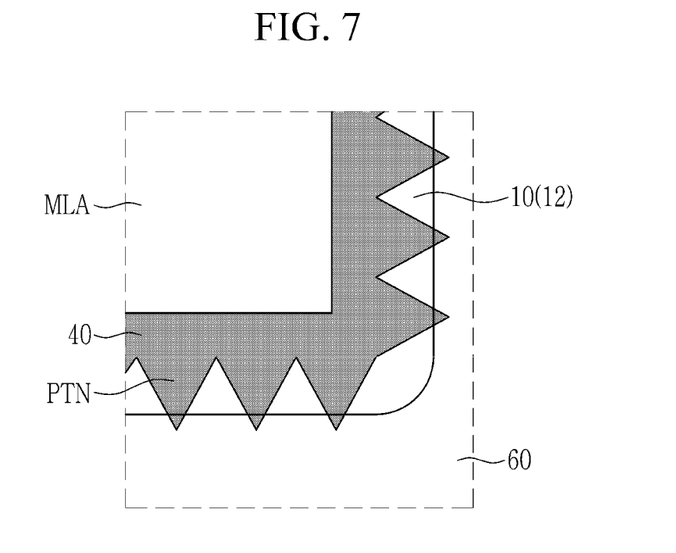

Referring to FIG. 5 to FIG. 7, on a plane, the pattern PTN of the photo absorption layer 40 may have a shape in which a triangle with one vertex facing the bonding layer 60 is continuously repeated.

According to an example embodiment, on a plane, the end of the outer direction of the pattern PTN of the photo absorption layer 40 may extend to contact the bonding layer 60 (referring to FIG. 5). For example, the end of each triangle of the pattern PTN of the photo absorption layer 40 may contact the bonding layer 60. According to an example embodiment, on a plane, the end of the outer direction of the pattern PTN of the photo absorption layer 40 may be spaced apart from the bonding layer 60 (referring to FIG. 6). For example, the end of each triangle of the pattern PTN of the photo absorption layer 40 may be spaced apart from the bonding layer 60. Alternatively, according to an example embodiment, on a plane, the end of the outer direction of the pattern PTN of the photo absorption layer 40 may overlap the bonding layer 60 (referring to FIG. 7). For example, end portions of each triangle of the pattern PTN of the photo absorption layer 40 may overlap the bonding layer 60. However, the overlapping range may be a part of the end portion of the outer direction of the pattern PTN, and for example, may be less than 50% of the height of the pattern PTN.

Figure 8:
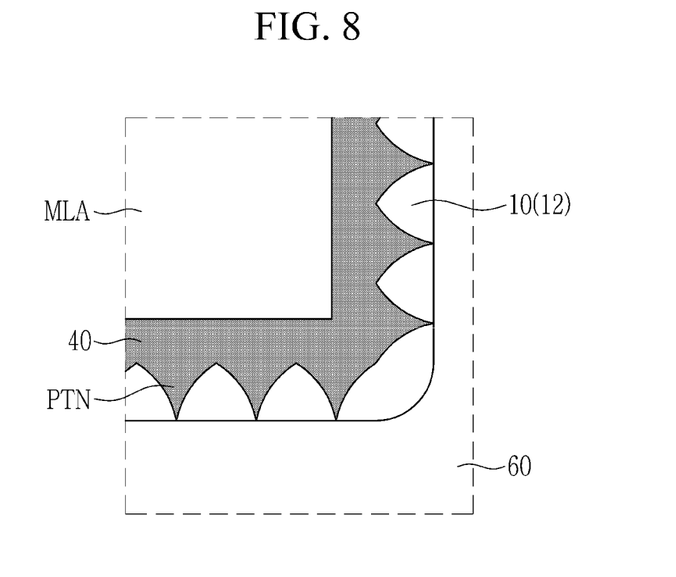
Figure 9:
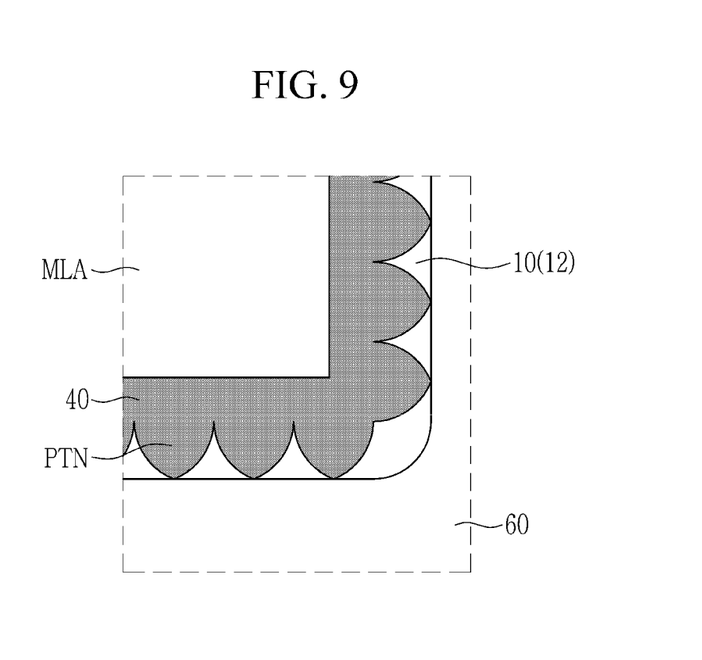

According to an example embodiment, on a plane, the pattern PTN of the photo absorption layer 40 may have a shape in which a triangle with one vertex facing the bonding layer 60 is continuously repeated, and at this time, two sides defining one vertex described above may have a convex or concave shape (referring to FIG. 8 and FIG. 9).

Figure 10:
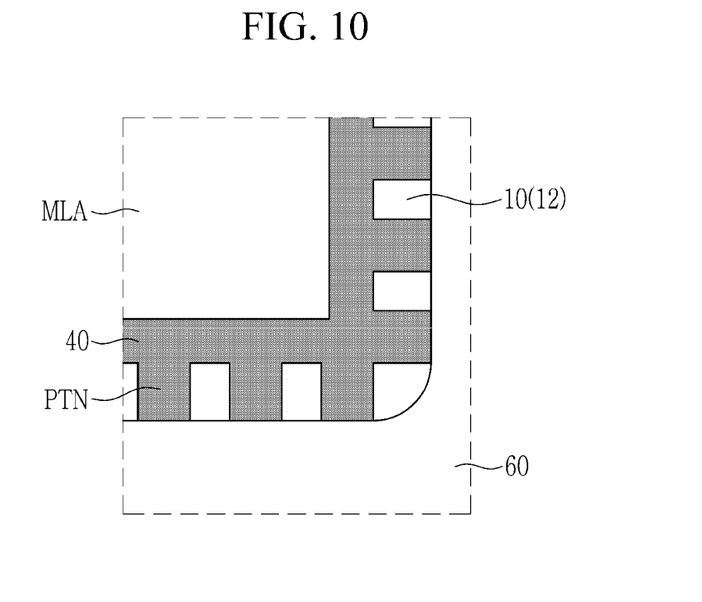
Figure 11:
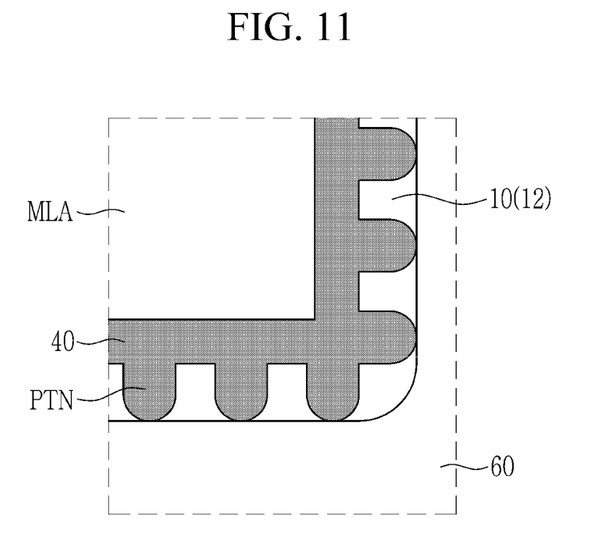

According to an example embodiment, on a plane, the pattern PTN of the photo absorption layer 40 may have a comb shape (referring to FIG. 10). For example, the pattern PTN of the photo absorption layer 40 may have a shape in which a polygonal protruding portion is repeated. Alternatively, according to an example embodiment, on a plane, the pattern PTN of the photo absorption layer 40 may have a shape in which the protruding portion of an arc shape or oval arc shape is repeated (referring to FIG. 11).

In the above, an example embodiment of the wire bonding method in which the image sensor chip 10 is connected to the package substrate 20 through a conductive wire has been described, but it is not limited thereto, and the image sensor chip 10 may be connected to the package substrate 20 by a flip chip method. Hereinafter, another embodiment of an image sensor package in which the image sensor chip 10 is connected to the package substrate 20 in a flip chip method will be described.

Figure 12:
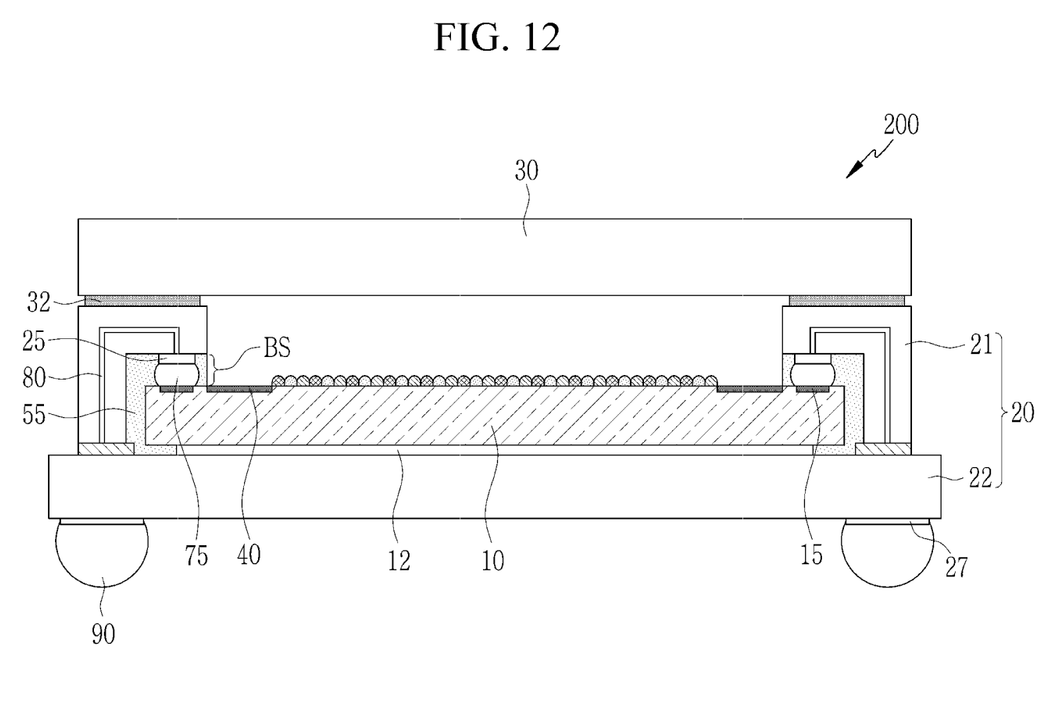
FIG. 12 is a cross-sectional view showing an image sensor package according to another example embodiment.

FIG. 12 is a cross-sectional view showing an image sensor package according to another example embodiment. That is, FIG. 12 shows the image sensor package 200 of an embodiment in which the image sensor chip 10 is connected to the package substrate 20 in the flip chip method. The descriptions of the same contents as the image sensor package 100 of the above-described embodiment are omitted, and only other contents are described. The sensor package 200 may include a photo absorption layer 40 having any of the patterns PTN described above in connection with FIGS. 5 through 11.

Referring to FIG. 12, the package substrate 20 may include a connection substrate 21 and a base substrate 22.

The connection substrate 21 may have an opening to expose the sensing area SA of the image sensor chip 10, and may have a shape surrounding the edge of the upper surface and the side surface of the image sensor chip 10. An expansion opening of which the opening is expanded so that the image sensor chip 10 may be inserted may be provided under the connection substrate 21. Alternatively, the connection substrate 21 may have a form in which a two-stepped cavity is formed. The connection substrate 21 may include a printed circuit board (PCB) formed of a ceramic material.

The transparent substrate 30 may be attached via a first adhesive member 32 onto the connection substrate 21.

The substrate pad 25 may be provided on the lower surface of the connection substrate 21. For example, the substrate pad 25 may be disposed facing the chip pad 15 of the image sensor chip 10.

According to an embodiment, a conductive bonding member 75 connecting between the chip pad 15 and the substrate pad 25 may include a bump. For example, the conductive bonding member 75 may include an Au bump formed by Au—Au bonding.

According to an embodiment, the conductive bonding member 75 may be encapsulated by the encapsulant 55. As shown in FIG. 12, the conductive bonding member 75, and the space between the image sensor chip 10 and the connection substrate 21 may be filled with the encapsulant 55. For example, the encapsulant 55 may include an underfill.

Meanwhile, in the present embodiment, the bonding structure BS may include the encapsulant 55 filling the aforementioned conductive bonding member 75, and the space between the image sensor chip 10 and the connection substrate 21.

The aforementioned connection substrate 21 may be electrically and physically coupled to the base substrate 22. According to an embodiment, the connection substrate 21 may include a conductive line 80 electrically connecting the substrate pad 25 and the base substrate 22.

The base substrate 22 may support the lower surface of the image sensor chip 10. For example, the image sensor chip 10 may be fixed to the base substrate 22 through the second adhesive member 12.

Although not shown, a wire line (not shown) electrically connected to the aforementioned conductive line 80 may be included inside the base substrate 22. At this time, the wire line may be electrically connected to the external connection terminal 90 through a conductive pad 27.

While this disclosure has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

DESCRIPTION OF SYMBOLS

- 10 image sensor chip
- 20 package substrate
- 30 transparent substrate
- 40 photo absorption layer
- 50, 55 encapsulant
- 60 adhesive layer
- 70, 75 conductive bonding member
- 80 conductive line
- 90 external connection terminal

What is claimed is:

1. An image sensor package comprising:
   an image sensor chip having a sensing area at a central part and an outer area surrounding the sensing area;
   a transparent substrate above and spaced apart from the image sensor chip and covering the image sensor chip;
   a bonding structure disposed between the image sensor chip and the transparent substrate and provided on an upper surface of the outer area; and
   a package substrate on which the image sensor chip is mounted and electrically connected to the image sensor chip,
   wherein the image sensor chip, on a plane, includes a photo absorption layer enclosing the sensing area and having a pattern protruded toward the bonding structure along a circumference of the photo absorption layer.

2. The image sensor package of claim 1, wherein on a plane, the end of the pattern in the outer direction overlaps the bonding structure.

3. The image sensor package of claim 1, wherein on a plane, the end of the pattern in the outer direction is spaced apart from the bonding structure.

4. The image sensor package of claim 1,
   wherein a chip pad is provided on the upper surface of the outer area,
   wherein the package substrate is provided with a substrate pad, and
   wherein the chip pad and the substrate pad are electrically connected to each other.

5. The image sensor package of claim 4, wherein the bonding structure includes an adhesive layer bonding the transparent substrate and the image sensor chip.

6. The image sensor package of claim 5, wherein the bonding structure further includes a ring-shaped spacer extending along the circumference of the lower surface of the transparent substrate.

7. The image sensor package of claim 5, wherein the image sensor chip is positioned on the package substrate and is electrically connected to the package substrate through a conductive wire connecting the chip pad and the substrate pad.

8. The image sensor package of claim 7, further comprising:
   an encapsulant disposed on the package substrate, and encapsulating a side of the image sensor chip, a side of the transparent substrate, the adhesive layer, and the conductive wire.

9. The image sensor package of claim 7, further comprising:
   an external connection terminal disposed on the lower surface of the package substrate and electrically connected to the substrate pad.

10. The image sensor package of claim 5, wherein the adhesive layer, on a plane, is continuously extended along the edge of the outer area.

11. The image sensor package of claim 4,
    wherein the package substrate includes:
    a connection substrate having an opening provided to expose the sensing area and surrounding the edge of the upper surface and the side surface of the image sensor chip; and
    a base substrate electrically connected to the connection substrate, combined with the connection substrate, and supporting the lower surface of the image sensor chip, and
    wherein the transparent substrate is attached on the connection substrate.

12. The image sensor package of claim 11,
    wherein an extension opening extending the opening is provided at the lower part of the connection substrate and the image sensor chip is provided in the extension opening, and
    wherein the substrate pad is provided on the lower surface of the connection substrate and faces the chip pad.

13. The image sensor package of claim 12, wherein the bonding structure includes:
    a bump connecting the chip pad and the substrate pad; and
    an encapsulant filling the space between the image sensor chip and the connection substrate and encapsulating the bump.

14. The image sensor package of claim 13, wherein the connection substrate includes a conductive line that electrically connects the substrate pad and the base substrate.

15. An image sensor package comprising:
    an image sensor chip having a sensing area having a microlens array on an upper surface and an outer area surrounding the sensing area and having a chip pad;
    a transparent substrate spaced apart from and above the image sensor chip and covering the image sensor chip;
    a bonding structure disposed between the image sensor chip and the transparent substrate and provided on an upper surface of the outer area;
    a package substrate on which a substrate pad is provided on one surface and the image sensor chip is mounted and electrically connected to the image sensor chip; and
    a conductive bonding member connecting the chip pad and the substrate pad,
    wherein the image sensor chip, on a plane, includes a photo absorption layer surrounding the microlens array and having a pattern protruded toward the bonding structure along a circumference of the photo absorption layer.

16. The image sensor package of claim 15,
wherein the image sensor chip, on a cross-section, further includes a semiconductor layer and a passivation layer on the semiconductor layer, and
wherein the photo absorption layer is positioned between the semiconductor layer and the passivation layer.

17. The image sensor package of claim 15, wherein the pattern has a shape in which a protruding portion of a polygonal shape or an arc-shape is repeated on a plane.

18. The image sensor package of claim 15, wherein the pattern has a shape in which a triangle with one vertex facing the bonding structure is continuously repeated on a plane.

19. The image sensor package of claim 18, wherein the triangle has a convex or concave form of two sides defining the one vertex.

20. An image sensor package comprising:
an image sensor chip having a sensing area having a microlens array on an upper surface and an outer area surrounding the sensing area and having a chip pad;
a transparent substrate spaced apart above the image sensor chip and covering the image sensor chip;
a bonding structure disposed between the image sensor chip and the transparent substrate and provided on an upper surface of the outer area;
a package substrate on which a substrate pad is provided on one surface and the image sensor chip is mounted and electrically connected to the image sensor chip;
a conductive bonding member connecting the chip pad and the substrate pad; and
an external connection terminal provided on the package substrate, electrically connected to the substrate pad, and protruded to the outside,
wherein the image sensor chip, on a plane, includes a photo absorption layer surrounding the microlens array, and having a pattern of a sawtooth shape or a comb shape that is protruded toward the bonding structure along a circumference of the photo absorption layer.

* * * * *